United States Patent
Wang et al.

(10) Patent No.: US 7,082,160 B2
(45) Date of Patent: Jul. 25, 2006

(54) PULSE WIDTH CONTROL SYSTEM FOR TRANSMITTING SERIAL DATA

(75) Inventors: Yi-Tang Wang, Hsin-Chu (TW); Yu-Chin Chu, Hsin-Chu Hsien (TW)

(73) Assignee: Faraday Technology Corp., Hsin-Chu (TW)

( * ) Notice: Subject to any disclaimer, the term of this patent is extended or adjusted under 35 U.S.C. 154(b) by 755 days.

(21) Appl. No.: 10/064,970

(22) Filed: Sep. 5, 2002

(65) Prior Publication Data

US 2004/0047412 A1    Mar. 11, 2004

(51) Int. Cl.
*H03K 7/08* (2006.01)
*H03H 11/26* (2006.01)
*H03F 3/45* (2006.01)

(52) U.S. Cl. .................. 375/238; 327/272; 330/253
(58) Field of Classification Search ............... 375/238, 375/239, 257, 318, 364; 327/269, 272, 274; 330/252, 253
See application file for complete search history.

(56) References Cited

U.S. PATENT DOCUMENTS

| | | | | |
|---|---|---|---|---|
| 4,691,120 A | * | 9/1987 | Kondo | 327/172 |
| 5,434,523 A | * | 7/1995 | Sundstrom | 327/172 |
| 5,617,452 A | * | 4/1997 | Haulin et al. | 375/354 |
| 5,789,989 A | * | 8/1998 | Paschal et al. | 331/57 |
| 6,661,271 B1 | * | 12/2003 | Burdick et al. | 327/269 |

* cited by examiner

*Primary Examiner*—Young T. Tse
(74) *Attorney, Agent, or Firm*—Winston Hsu

(57) ABSTRACT

A pulse width control system includes a serial transmission line for receiving serial data signals and a differential pair having a first transistor and a second transistor. The first and second transistors are connected to the transmission line for respectively producing a positive data signal and a negative data signal. The first and second transistors are respectively controlled by a first control signal and a second control signal, with a differential data signal being produced by subtracting the negative data signal from the positive data signal. First and second delay control cells are connected to the first and second transistors for respectively delaying the first and second control signals. Delay times caused by the first and second delay control cells to delay the first and second control signals are adjusted to ensure that all data pulses of the differential data signal have uniform width.

7 Claims, 6 Drawing Sheets

PULSE WIDTH CONTROL SYSTEM FOR TRANSMITTING SERIAL DATA

BACKGROUND OF INVENTION

1. Field of the Invention

The present invention relates to a pulse width control system, and more specifically, to a pulse width control system for ensuring that serial data pulses are transmitted with uniform pulse widths.

2. Description of the Prior Art

Recently, many popular electronic devices have begun to use a high speed serial bus for providing communication between the electronic devices and computers. Examples of high speed serial buses include USB (Universal Serial Bus) and IEEE 1394. With each of these two buses, data is transmitted at high speed one bit at a time.

Reffering to FIG. 1. FIG. 1 is a circuit diagram of a prior art differential pair circuit 10 used for transmitting data to a high speed serial bus. Serial data signal DATA is sent across the serial bus and transmitted by the differential pair circuit 10. The differential pair circuit 10 contains a first transistor M1 and a second transistor M2 for respectively producing a positive data signal DataP and a negative data signal DataN. In addition, a bias voltage Vbias is applied to a third transistor M3 for biasing the differential pair circuit 10. The first transistor M1 is controlled by a first control signal CTRL1 and the second transistor M2 is controlled by a second control signal CTRL2. Each of these control signals selectively opens and closes the corresponding transistors according to a value of the serial data signal DATA. The serial data signal DATA can either transmit a logical value of "0", "1" when in transmit mode, or not transmit any values when in idle mode. The following logic values are given under the assumption that first and second transistors M1 and M2 are PMOS transistors, although any kind of transistors could be used. Please see Table 1 below to see the relationship between values of the serial data signal DATA, the first and second control signals CTRL1 and CTRL2, and the positive and negative data signals DataP and DataN.

TABLE 1

| MODE | DATA | CTRL1 | CTRL2 | DataP | DataN |
|---|---|---|---|---|---|
| Transmit | 0 | 1 | 0 | 0 | 1 |
| Transmit | 1 | 0 | 1 | 1 | 0 |
| Idle | — | 1 | 1 | 0 | 0 |

When the serial data signal DATA has a value of "1", the first control signal CTRL1 closes the first transistor M1 and the second control signal CTRL2 opens the second transistor M2. The exact opposite happens when the serial data signal DATA has a value of "0". Thus, during transmit mode, the positive data signal DataP is an exact duplicate of the serial data signal DATA, and the negative data signal DataN is the logical opposite. In idle mode, the serial data signal DATA does not transmit any data. During this situation, the first and second control signals CTRL1 and CTRL2 each have a value of "1". Therefore, the positive and negative data signals DataP and DataN each have a value of "0".

A differential signal DIFF is calculated by subtracting the negative data signal DataN from the positive data signal DataP. Reffering to FIG. 2. FIG. 2 is a timing diagram of the differential signal DIFF with respect to the serial data signal DATA. As shown in FIG. 2, when the serial data signal DATA is in idle mode, the differential signal DIFF has a value of 0 volts since both the positive and negative data signals DataP and DataN have a value of 0 volts. When the serial data signal DATA is has a value of "1", the differential signal DIFF has a value of +V volts (V represents a voltage value of logical "1") since the positive data signal DataP has a value of +V volts and the negative data signal DataN has a value of 0 volts. Finally, when the serial data signal DATA is has a value of "0", the differential signal DIFF has a value of −V volts since the positive data signal DataP has a value of 0 volts and the negative data signal DataN has a value of V volts. As shown by the sloped lines connecting the +V and −V values of the differential signal DIFF, low slew rates limit the speed at which the differential signal can change values.

Unfortunately, when switching from idle mode to transmit mode, the prior art differential pair circuit 10 has a problem of non-uniform pulse widths. Reffering to FIG. 3. FIG. 3 is a timing diagram showing pulse widths of data signals generated by the differential pair circuit 10. Values of the positive data signal DataP, the negative data signal DataN, and the differential signal DIFF are all shown with respect to time. From time t0 to t1, the serial data signal DATA is in idle mode. Therefore both the positive and negative data signals DataP and DataN and the differential signal DIFF all have a value of 0 volts. At time t1, the serial data signal data switches from idle mode to transmit mode, and the value of the positive data signal DataP begins to rise to +V volts. Because of the slew rate, however, it takes until time t2 to actually reach the value of +V volts. The value of positive data signal DataP continues to have a value of +V volts until time t4. At time t4, the value of the positive data signal DataP gradually begins to change to 0 volts, and by time t5, the value is back at +V volts. Finally, this value of +V volts is kept from time t5 until time t6. As shown from time t1 to t6, when in transmit mode, the negative data signal DataN has exactly the opposite logical value of the positive data signal DataP. Therefore, the differential signal DIFF ranges from a maximum value of +V volts to a minimum value of −V volts.

During transmit mode, the differential signal DIFF repeatedly alternates between pulses with a +V value and pulses with a V value. However, upon careful inspection of FIG. 3, it can be seen that the width of first pulse of the positive data signal DataP is actually larger than any of the other pulses. By comparing first and second pulses of the positive data signal DataP, the difference becomes more apparent. The first pulse lasts from time t2 to time t4, while the second pulse lasts from time t5 to t6. The difference in pulse width between the first and second pulses is noted as ΔT, which is the interval of time from time t2 to time t3. In other words, the interval from time t3 to time t4 is exactly the same interval as from time t5 to time t6.

Since the first pulse of the positive data signal DataP has a larger width, the first pulse of the differential signal DIFF also has a larger width. This anomaly occurs on every first pulse immediately following the switch from idle mode to transmit mode. Thus, every time the differential pair circuit 10 comes out of idle mode and starts receiving data, the first pulse will be wider than all subsequent pulses. This inconsistency in pulse widths leads to potential data corruption due to the change in timing parameters. This means that data could possibly be lost starting from the first pulse in transmit mode.

SUMMARY OF INVENTION

It is therefore a primary objective of the claimed invention to provide a pulse control system in order to solve the above-mentioned problems.

According to the claimed invention, a pulse width control system comprises a serial transmission line for receiving serial data signals and a differential pair having a first transistor and a second transistor. The first and second transistors are connected to the transmission line for respectively producing a positive data signal and a negative data signal. The first and second transistors are respectively controlled by a first control signal and a second control signal, with a differential data signal being produced by subtracting the negative data signal from the positive data signal. First and second delay control cells are connected to the first and second transistors for respectively delaying the first and second control signals. Delay times caused by the first and second delay control cells to delay the first and second control signals are adjusted to ensure that all data pulses of the differential data signal have uniform width.

It is an advantage of the claimed invention that the first and second delay control cells are used to selectively delay the first and second control signals. By selecting proper delay times, the first and second control cells ensure that all data pulses have uniform width. This pulse uniformity helps ensure the integrity of data being received on the serial transmission line.

These and other objectives of the claimed invention will no doubt become obvious to those of ordinary skill in the art after reading the following detailed description of the preferred embodiment, which is illustrated in the various figures and drawings.

Table 1 shows a relationship between values of the serial data signal, first and second control signals, and positive and negative data signals.

DETAILED DESCRIPTION

Figure 1:
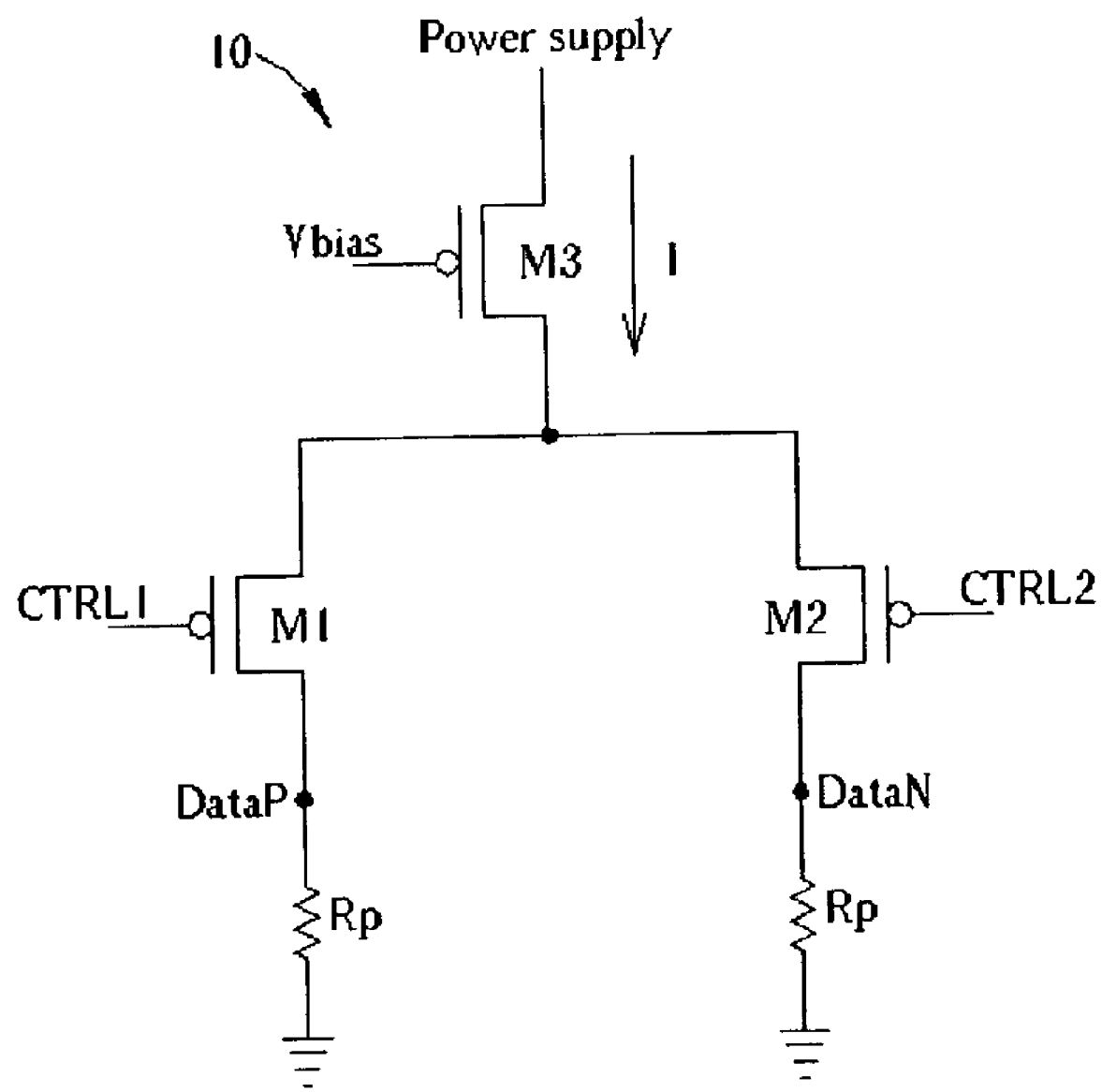
FIG. 1 is a circuit diagram of a prior art differential pair circuit used for receiving data from a high speed serial bus.
Figure 2:
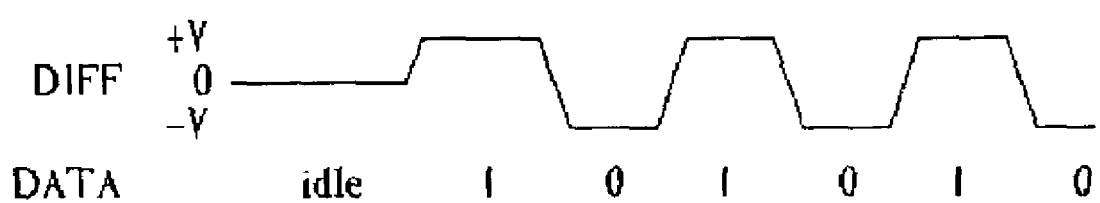
FIG. 2 is a timing diagram of a differential signal with respect to a serial data signal.
Figure 3:
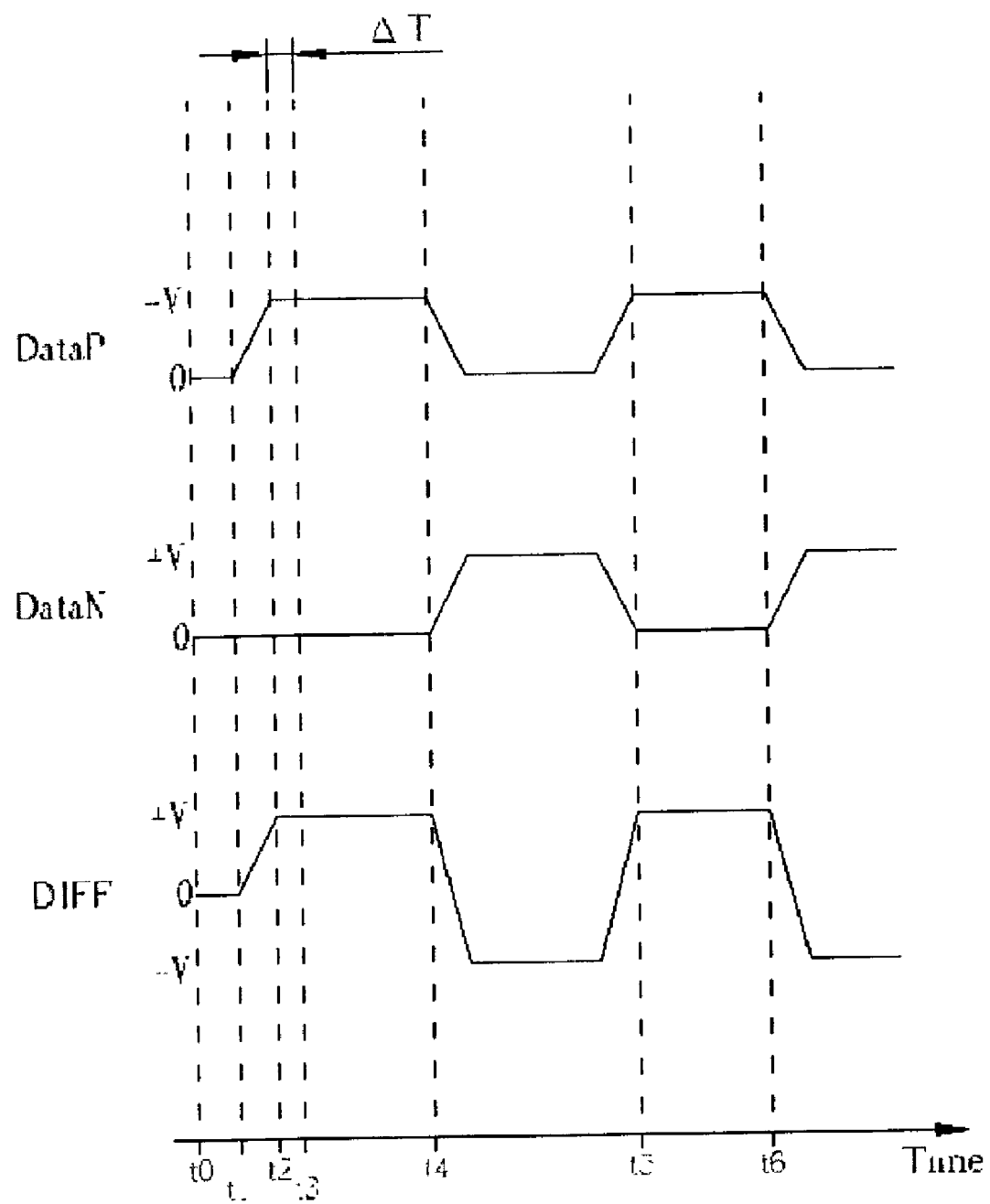
FIG. 3 is a timing diagram showing pulse widths of data signals generated by the differential pair circuit.
Figure 4:
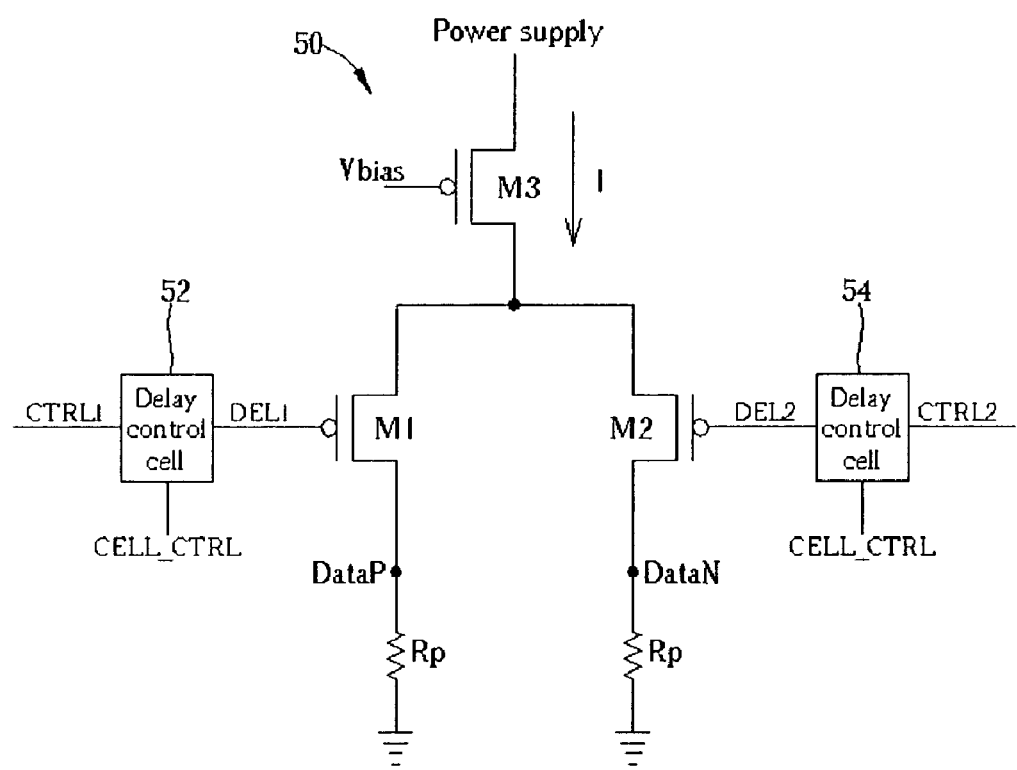
FIG. 4 is a circuit diagram of a pulse width control system used in receiving high speed serial data.

Reffering to FIG. 4. FIG. 4 is a circuit diagram of a pulse width control system 50 used in transmitting high speed serial data. The pulse width control system 50 functions much like the prior art differential pair circuit 10 shown in FIG. 1.

Serial data signal DATA is sent across the serial bus and received by the pulse width control system 50. The pulse width control system 50 contains the first and second transistors M1 and M2 for respectively producing the positive and negative data signals DataP and DataN. The bias voltage Vbias is applied to the third transistor M3 for biasing the pulse width control system 50.

For controlling delay times of control signals, the pulse width control system 50 also includes first and second delay control cells 52 and 54 for respectively delaying control signals sent to the first and second transistors M1 and M2. Both the first and second delay control cells are controlled by a cell control signal CELL_CTRL, which controls the amount of delay that each delay control cell will provide to signals being delayed. In fact, the main difference between the prior art differential pair circuit 10 and the present invention pulse width control system 50 is the use of the first and second delay control cells 52 and 54.

The first delay control cell 52 receives the first control signal CTRL1, delays the signal for a period of time, and then outputs a first delayed signal DEL1 to the first transistor M1. Likewise, the second delay control cell 54 receives the second control signal CTRL2, delays the signal for a period of time, and then outputs a second delayed signal DEL2 to the second transistor M2. Although all transistors shown in FIG. 4 are shown as PMOS transistors, any type of transistors can be used in the present invention. Reffering back to Table 1 to see the relationship between values of the serial data signal DATA, the first and second control signals CTRL1 and CTRL2, and the positive and negative data signals DataP and DataN.

In the present invention, two data transmission modes are identified. In idle mode, no data is being sent in the serial data signal DATA, and in transmit mode, serial data is being sent to the pulse width control system 50. As stated above, the problem with the prior art differential pair circuit 10 is that after the switch from idle mode to transmit mode, the first pulse of the differential signal DIFF was too wide. To correct this problem, the first and second delay control cells 52 and 54 create two different delay times. Delay T1 is used to create a short delay when the pulse width control system 50 receives data in transmit mode. Delay T2 is used to create a longer delay for the first pulse after the switch from idle mode to transmit mode. This longer delay T2 will help shorten the first pulse, and allow all pulses to have uniform width.

Figure 5:
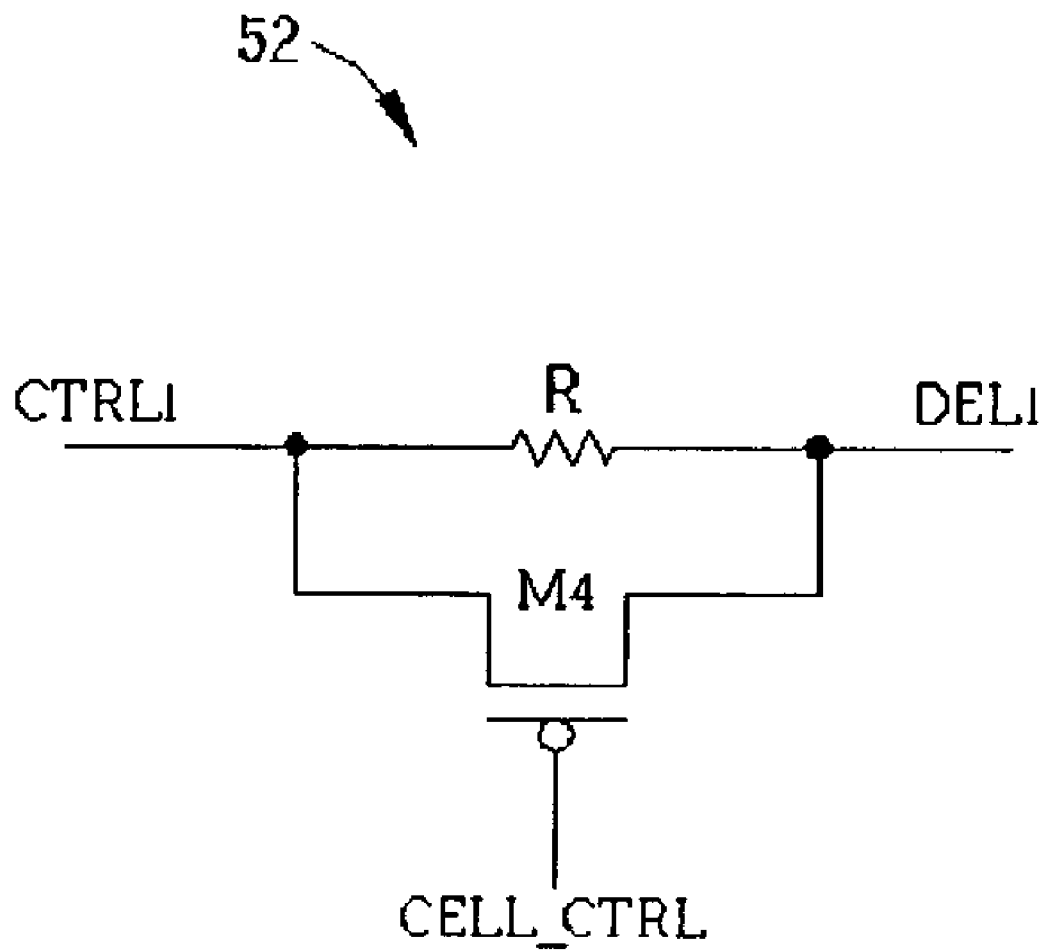
FIG. 5 is a circuit diagram of a sample first delay control cell.

Reffering to FIG. 5. FIG. 5 is a circuit diagram of a sample first delay control cell 52. The cell control signal CELL_CTRL is used to open and close a fourth transistor M4. Depending on the value of the cell control signal CELL_CTRL, the first control signal CTRL1 will either travel in parallel through the fourth transistor M4 and a resistor R, or travel only through the resistor R. The result will be the first delayed signal DEL1, which is simply a delayed version of the first control signal CTRL1. Specifically, if the cell control signal CELL_CTRL has a value of "0", the fourth transistor M4 will close. This causes the first control signal CTRL to travel in parallel across the resistor R and the closed fourth transistor M4, which produces a short delay T1. On the other hand, if the cell control signal CELL_CTRL has a value of "1", the fourth transistor M4 will open. This causes the first control signal CTRL to travel solely across the resistor R, which produces a longer delay T2. The delay times T1 and T2 are chosen such that T2−T1=ΔT. Remember that in the prior art differential pair circuit 10, ΔT is the amount of extra time contained in the first pulse after a switch from idle mode to transmit mode when compared to other pulses in transmit mode.

The first delay control cell 52 shown in FIG. 5 is used as an example only. Many different structures can be used to form a delay control cell such as resistor strings or capacitor arrays. In addition, a pure logic structure can be used in the delay control cells, with delay times caused by propagation delays of signals traveling through the logic. The cell control signal CELL_CTRL can also be used to create varying levels of delay time. In this case, the voltage level of the cell control signal CELL_CTRL would be altered to change channel width of the fourth transistor M4, thus changing the speed at which signals could pass through the fourth transistor M4.

Figure 6:
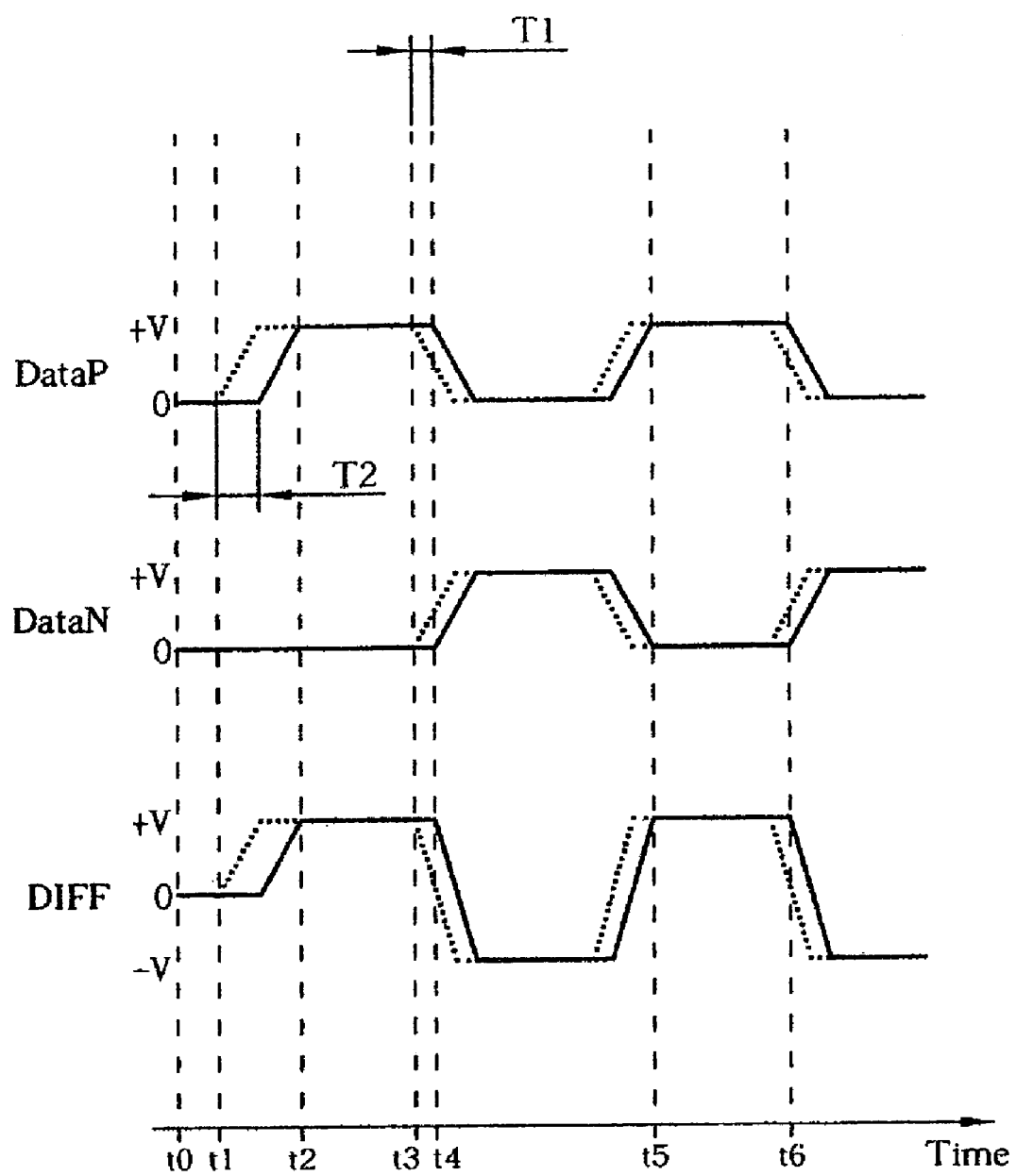
FIG. 6 is a timing diagram showing pulse widths of data signals generated by the pulse width control system.

Reffering to FIG. 6. FIG. 6 is a timing diagram showing pulse widths of data signals generated by the pulse width control system 50. The dotted line pulses represent data signals that would have been generated with the prior art differential pair circuit 10. The solid line pulses represent data signals using the present invention pulse width control system 50. The solid line pulses are simply delayed versions of the dotted line pulses. From time t0 to time t1, the serial data signal DATA is in idle mode. Therefore both the positive and negative data signals DataP and DataN and the differential signal DIFF all have a value of 0 volts. At time t1, the serial data signal DATA switches from idle mode to transmit mode. At this time, the first control signal CTRL1 also changes to pass the value of the serial data signal DATA to the positive data signal DataP. However, since this is the first pulse after the transition from idle mode to transmit mode, the first delay control cell 52 delays the first control signal CTRL1 for a delay time T2. Thus the value of the positive data signal DataP begins to rise to +V volts at a time of t1+T2. Because of the slew rate, however, it takes until time t2 to actually reach the value of +V volts. The value of the serial data signal DATA remains at +V volts until time t3, when it begins to fall back to 0 volts. At this time, the first control signal CTRL1 also changes to pass the value of the serial data signal DATA to the positive data signal DataP. First, since this is not the first pulse in transmit mode, the first delay control cell 52 delays the first control signal CTRL1 for a delay time T1. Thus the value of the positive data signal DataP begins to fall to 0 volts at a time of t3+T1, which is the same as time t4. Now in transmit mode, the first and second delay control cells 52 and 54 continue to delay the first and second control signals CTRL1 and CTRL2 for a delay time T1.

Notice that only the first pulse after the switch from idle mode to transmit mode was delayed by a delay time T2, and all other pulses are delayed by a delay time T1. That is because without correction, the first pulse has a pulse width that is too large. Therefore, the present invention pulse width control system 50 adjusts the width of the first pulse such that all pulses have uniform width. By comparing first and second pulses of the positive data signal DataP, the effect of the present invention is shown. The first pulse lasts from time t2 to time t4, while the second pulse lasts from time t5 to t6. These two pulses have exactly the same width, whereas the dotted line pulses of the present invention do not.

Compared to the prior art, the present invention pulse width control system 50 uses the first and second delay control cells 52 and 54 to control pulse widths of the differential signal DIFF created from subtracting the negative data signal DataN from the positive data signal DataP. By using the pulse width control system 50, the first pulse of the differential signal DIFF created after the switch from idle mode to transmit mode has exactly the same pulse width as all other pulses created during transmit mode. This uniformity in pulse width helps to ensure the integrity of the serial data sent in high speed serial buses.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A pulse width control system comprising:
   a serial transmission line for receiving serial data signals;
   a differential pair having a first transistor and a second transistor, the first and second transistors being connected to the transmission line for respectively producing a positive data signal and a negative data signal, the first transistor being controlled by a first control signal and the second transistor being controlled by a second control signal, a differential data signal being produced by subtracting the negative data signal from the positive data signal;
   a first delay control cell connected to the first transistor for delaying the first control signal;
   a second delay control cell connected to the second transistor for delaying the second control signal;
   wherein delay times caused by the first and second delay control cells to delay the first and second control signals are adjusted to ensure that all data pulses of the differential data signal have uniform width, when a status of the serial transmission line remains in a transmit mode, the first and second delay control cells generate a first delay time, and when a status of the serial transmission line switches from an idle mode to the transmit mode, the first and second delay control cells generate a second delay time, the first and second delay times being unequal.

2. The system of claim 1 wherein the second delay time is larger than the first delay time.

3. The system of claim 1 wherein the second delay time is generated to delay exactly one data pulse after the serial transmission line switches from the idle mode to the transmit mode.

4. The system of claim 1 wherein the first and second delay control cells each comprises controllable resistor strings for providing delay times.

5. The system of claim 1 wherein the first and second delay control cells each comprises logic circuitry, and delay times are produced by propagation delays of the logic circuitry.

6. The system of claim 1 wherein the first and second delay control cells each comprises a control transistor, and delay times are produced by varying voltage levels of signals that control the control transistor in order to change channel widths of the control transistor.

7. The system of claim 1 wherein the first and second delay control cells each comprises a control transistor in parallel with a resistor, and each of the first and second delay times is produced by varying voltage levels of signals that control the control transistor in order to change channel widths of the control transistor.

* * * * *